United States Patent
Baree et al.

(10) Patent No.: US 7,157,966 B2
(45) Date of Patent: Jan. 2, 2007

(54) MULTI-MODE POWER AMPLIFIER

(75) Inventors: Atiqul Baree, Methuen, MA (US); Gary Hau, Nashua, NH (US); Mikhail Shirokov, Methuen, MA (US); James A. Roche, Jr., Franklin, MA (US)

(73) Assignee: Fairchild Semiconductor Corporation, South Porland, ME (US)

( * ) Notice: Subject to any disclaimer, the term of this patent is extended or adjusted under 35 U.S.C. 154(b) by 75 days.

(21) Appl. No.: 11/016,397

(22) Filed: Dec. 17, 2004

(65) Prior Publication Data

US 2006/0132232 A1   Jun. 22, 2006

(51) Int. Cl.
*H03G 5/16*   (2006.01)

(52) U.S. Cl. ...................... 330/133; 330/310

(58) Field of Classification Search .............. 330/295, 330/124 R, 302, 296, 285, 133, 310
See application file for complete search history.

(56) References Cited

U.S. PATENT DOCUMENTS 5,051,706 A * 9/1991 Zushi ......................... 330/277
6,791,407 B1 * 9/2004 Grebennikov et al. ...... 330/133

* cited by examiner

*Primary Examiner*—Henry Choe
(74) *Attorney, Agent, or Firm*—Sidley Austin LLP

(57) ABSTRACT

A power amplifier includes an input network, output stages, coupled in parallel and configured to output power optimally in corresponding power-ranges, the output stages coupled to the input network, an output impedance matching network, coupled to the output stages and not containing a switching element, and a bias-control network, coupled between the output impedance matching network, the input network, and the output stages. In some amplifiers the output impedance matching network does not contain a switching element corresponding to the output stage configured to output power in the highest range. In other amplifiers the bias-control network is configured to isolate output stages by providing a hard shut-off to transistors of the isolated output stages.

27 Claims, 13 Drawing Sheets

MULTI-MODE POWER AMPLIFIER

BACKGROUND

1. Field of Invention

The present invention relates to power amplifiers and more particularly to multi-mode power amplifiers with improved linearity and reduced current consumption.

2. Description of Related Art

Power amplifiers are ubiquitous in modern electronics. There is a constant demand to decrease the power consumption and increase the linearity of power amplifiers in consumer electronic devices, especially portable devices. Conventional designs of power amplifiers focused on optimizing the power consumption and transmission characteristics for power outputs at the highest power-ranges.

However, a remarkable observation is represented by FIG. 2. The probability density function (PDF) of the usage of portable devices, such as cell phones, reveals that most of the time these devices are used at powers nowhere near the highest power-ranges. A key reason for this fact is that cell phones are typically in close proximity to the nearest base station. Therefore, the power of the output signal is far from their highest value. This observation poses new design challenges for power amplifiers.

One of these challenges is that power amplifiers have to amplify the received, or input, signals in a very broad range by the same factor. In other words, the output of power amplifiers has to be a linear function of its input over a broad power-range.

Another challenge is that power amplifiers, which were optimized for power output at the highest power-ranges consume unduly large currents at the typical lower power ranges.

Some existing designs address this problem by including two parallel-coupled output stage transistors, optimized for amplifying signals in a low power-range and in a high power-range. Signals with a typical power-range are routed through the low power output transistor, but when the signal's power-range increases to a high range, a bias-control circuit reconfigures the power amplifier by switching the signal route, or transmission path, through the high power output transistor.

Further, the signal, output from the parallel-coupled output stages, is coupled into an output impedance matching network to maximize power transfer to a standard 50 ohm system. In existing designs, there are separate output impedance matching networks coupled to the two parallel output transistors. When the signal route is changed from the low to the high power output transistor, a control circuit reconfigures the output impedance matching network as well by switching from the corresponding low power to the high power output impedance matching network.

However, these designs employ a switching element in the output transmission path. Such switching elements introduce non-linearities and losses into the transmission characteristics, occupying valuable chip area and requiring supply current.

SUMMARY

Briefly and generally, embodiments include a power amplifier, including an input network, output stages, coupled in parallel and configured to output power optimally in corresponding power-ranges, the output stages coupled to the input network, an output impedance matching network, coupled to the output stages and not containing a switching element, and a bias-control network, coupled between the output impedance matching network, the input network, and the output stages.

Further embodiments include a power amplifier, including an input network, output stages coupled in parallel and configured for outputting power optimally in corresponding ranges, the output stages coupled to the input network, an output impedance matching network, coupled to the output stages, and a bias-control network, coupled between the output impedance matching network, the input network, and the output stages, wherein the output impedance matching network does not contain a switching element in the output stage configured to output power in the highest range.

Further embodiments include a power amplifier, including an input network, output stages, coupled in parallel and configured to output power optimally in corresponding power-ranges, the output stages coupled to the input network, an output impedance matching network, coupled to the output stages, and a bias-control network, coupled between the output impedance matching network, the input network, and the output stages, wherein the bias-control network is configured to isolate output stages by providing a hard shut-off to transistors of the isolated output stages.

DETAILED DESCRIPTION

Figure 1:
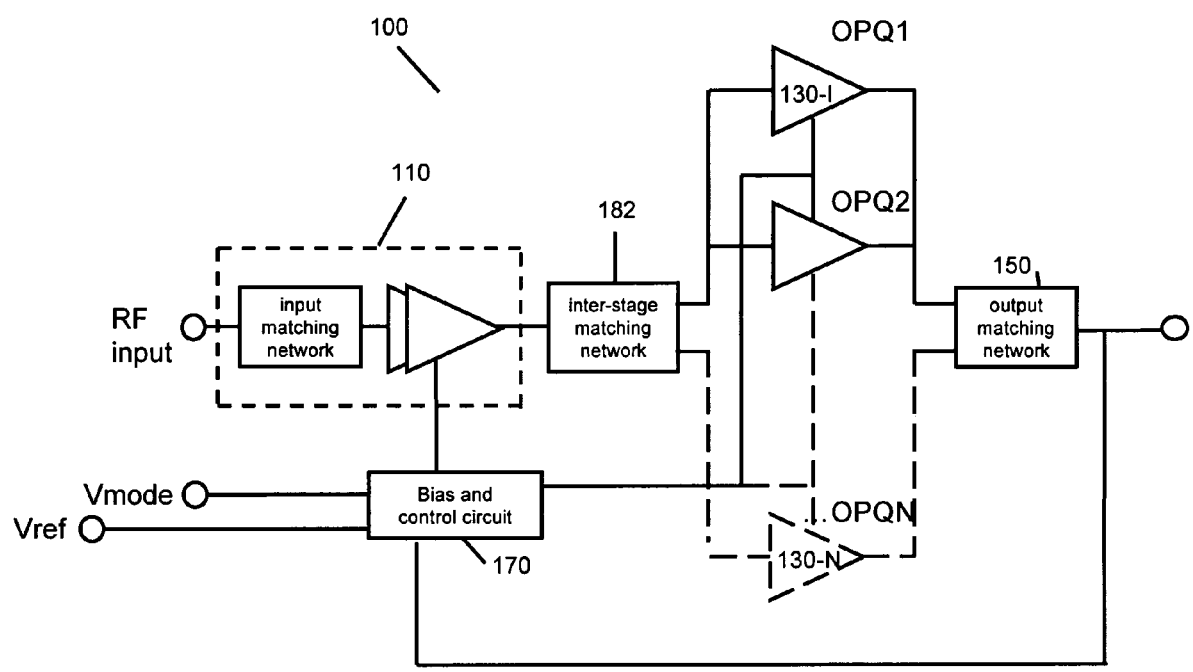
FIG. 1 illustrates a block diagram of a power amplifier according to an embodiment of the invention.
Figure 2:
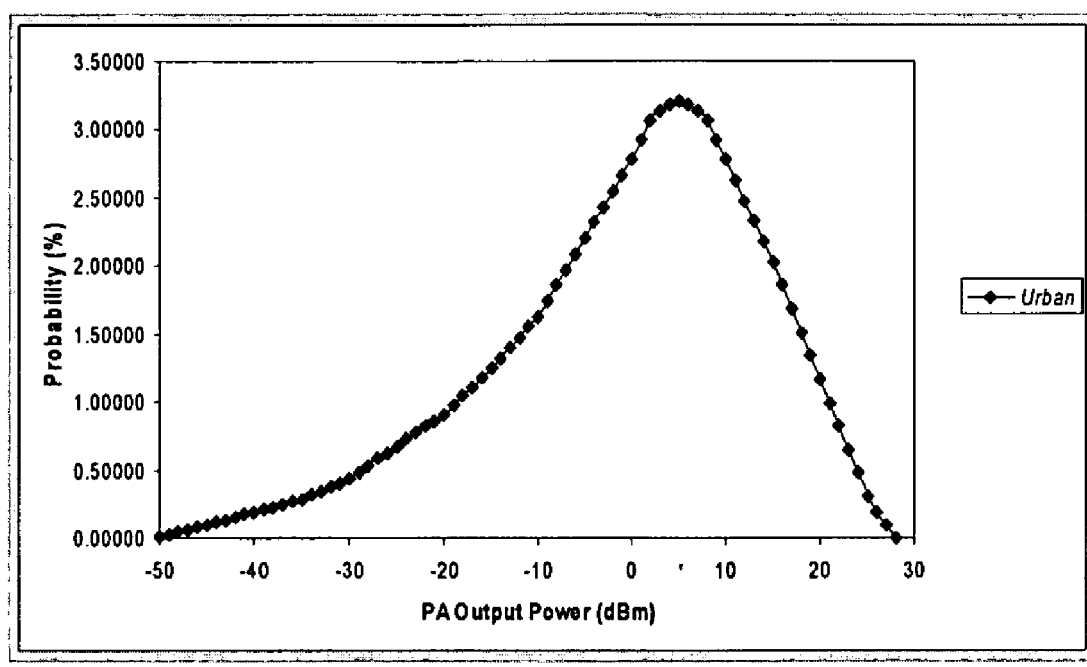
FIG. 2 illustrates a probability density function, characterizing the power usage of power amplifiers for CDMA cell phones in existing designs.

FIG. 1 illustrates a power amplifier 100 according to embodiments of the invention. Power amplifier 100 includes an input network 110, output stages 130, an output impedance matching network 150, and a bias-control network 170.

In embodiments input network 110 includes a single radio-frequency input circuit 102, coupled to it an input matching network 104, which is coupled into a shared first amplifier stage 106. As described later, shared first amplifier stage 106 is also coupled to bias-control network 170. In various applications including cell phones and other wireless systems single radio-frequency input circuit 102 receives its signal from a receiver antenna or another radio-frequency signal source.

A function of input matching network 104 is to reduce/minimize reflections of the incoming rf signal to input network 110. The input signal then enters into shared first amplifier stage 106, which may contain more than one amplifier stages within, as indicated by the double triangle symbol.

The signal, amplified by shared first amplifier stage 106, is coupled from input network 110 into output stages 130. Other embodiments do not have any shared amplifier stages. Instead, the input signal is directly coupled into output stages 130.

Output stages 130 include two or more output stage 130-1, 130-2, . . . 130-N, coupled in parallel. A function of output stages 130 is to output power in a power-range optimally. Signals in a power-range are coupled into the output stage, which is configured to amplify and transfer signals in that power-range optimally. With this design, power amplifier 100 can transmit and amplify signals in a wide range linearly and efficiently.

In some embodiments, the individual output stages 130-1, . . . , 130-N include output (or power-) transistors OPQ1, . . . , OPQN. Output transistors OPQ are optimized to amplify signals in a predetermined power-range optimally. The attributes of output transistors OPQ, such as the device size and bias, are chosen such that the overall power-range is well-covered by the power-ranges of the individual output stages 130-1, . . . , 130-N. Some embodiments contain two output stages 130-1 and 130-2, referred to as High and Low power output stages. Other embodiments contain several output stages 130-1, . . . , 130-N.

The signal amplified by output stages 130 is coupled into output impedance matching network 150. A function of output impedance matching network 150 is to match the impedance of power amplifier 100 with the subsequent circuitry for efficient power transmission. In some embodiments output impedance matching network 150 contains no switching element (such as transistors, diodes etc.), in contrast to existing designs. Since switching elements typically introduce non-linearities in the transfer characteristics, eliminating these switching elements reduces the non-linearity of the output of power amplifier 100. Therefore, embodiments of the present invention allow for optimal power transfer and power-added efficiency (PAE) over a broad transmitted power-range. Also, employing a single output impedance matching network 150 instead of separate output networks for each output stage 130-1, . . . , 130-N reduces the level of complexity of power amplifier 100 and its costs. As described below, in embodiments output impedance matching network 150 contains capacitors and inductors.

Power amplifier 100 further includes a bias-control network 170. Bias control network is coupled between output impedance matching network 150, input network 110, and output stages 130. A function of bias-control network 170 is to select the output stage 130-i, whose physical attributes make possible the transfer of power optimally in the sensed power-range. Bias-control network then enables output transistor OPQi of the selected output stage 130-i by providing an appropriate bias. Essentially simultaneously, bias-control network 170 disables and isolates all the non-selected output transistors by providing a hard shut-off. Embodiments of bias-control network will be described below.

Some embodiments include an inter-stage matching network 199, coupled between input network 110 and output stages 130. A function of inter-stage matching network 199 is to minimize the reflection of the signal output from input network 110 towards output stages 130. In some embodiments this function is carried out by resistive isolation.

Figure 3:
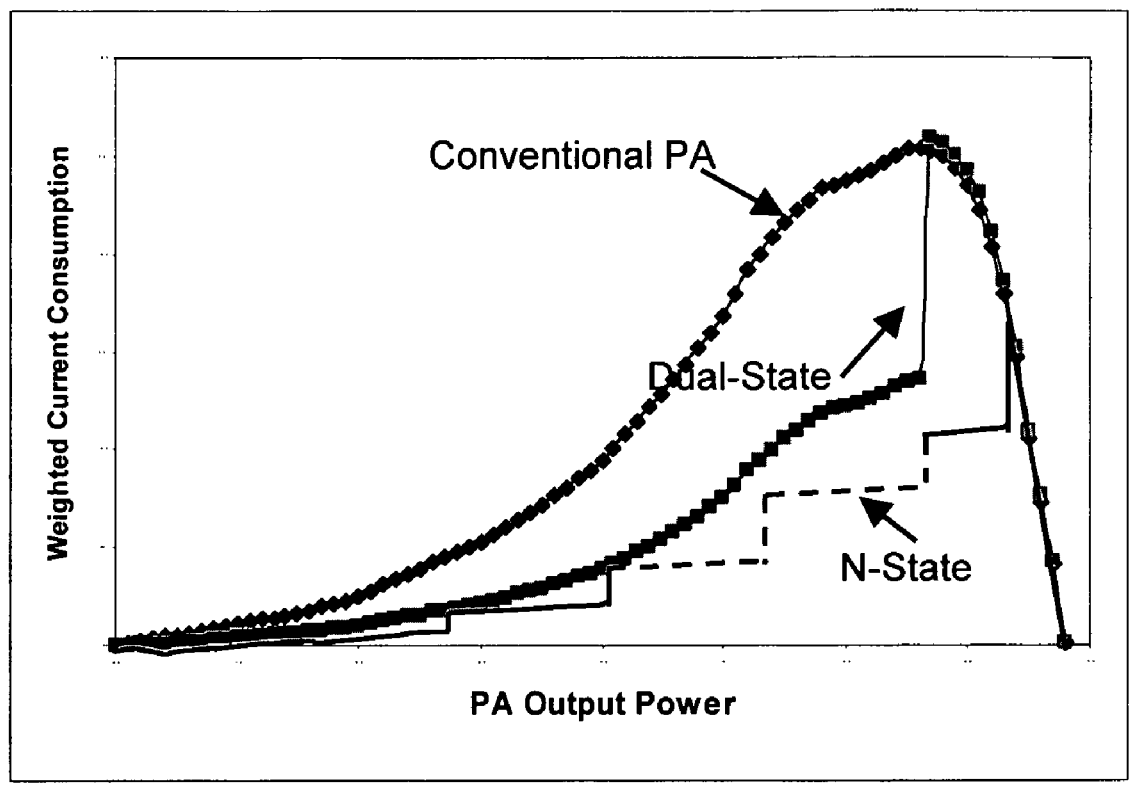
FIG. 3 illustrates a weighted current consumption function according to an embodiment of the invention.

FIG. 3 graphically illustrates the weighted current consumption of embodiments of the invention as a function of the output power of power amplifier 100. The diamonds of the top curve shows the current consumption of existing designs, using a single output stage. The curve exhibits a broad maximum. The squares of the middle curve show the current consumption of an embodiment with two output stages. As it is clearly visible, the current consumption in a broad lower power-range of the output power is greatly reduced. This is due to the fact that the single output stage of the existing amplifiers is designed to output power efficiently in the high power-range only. However, such designs are not optimal in the low power-range and thus the corresponding current consumption is excessive.

In contrast, the illustrated embodiment of the present invention utilizes an output stage optimized to amplify optimally in the low power-range, and one, optimized to amplify optimally in the high power range. The switchover between the low and the high power-range can be adjusted according to detailed design considerations. By amplifying the signal in the low power-range by an output stage, optimized to operate in this low power-range, the current consumption can be reduced by a substantial amount.

FIG. 3 also illustrates a generalized embodiment having N states, offering a current reduction over a wider range.

Figure 4:
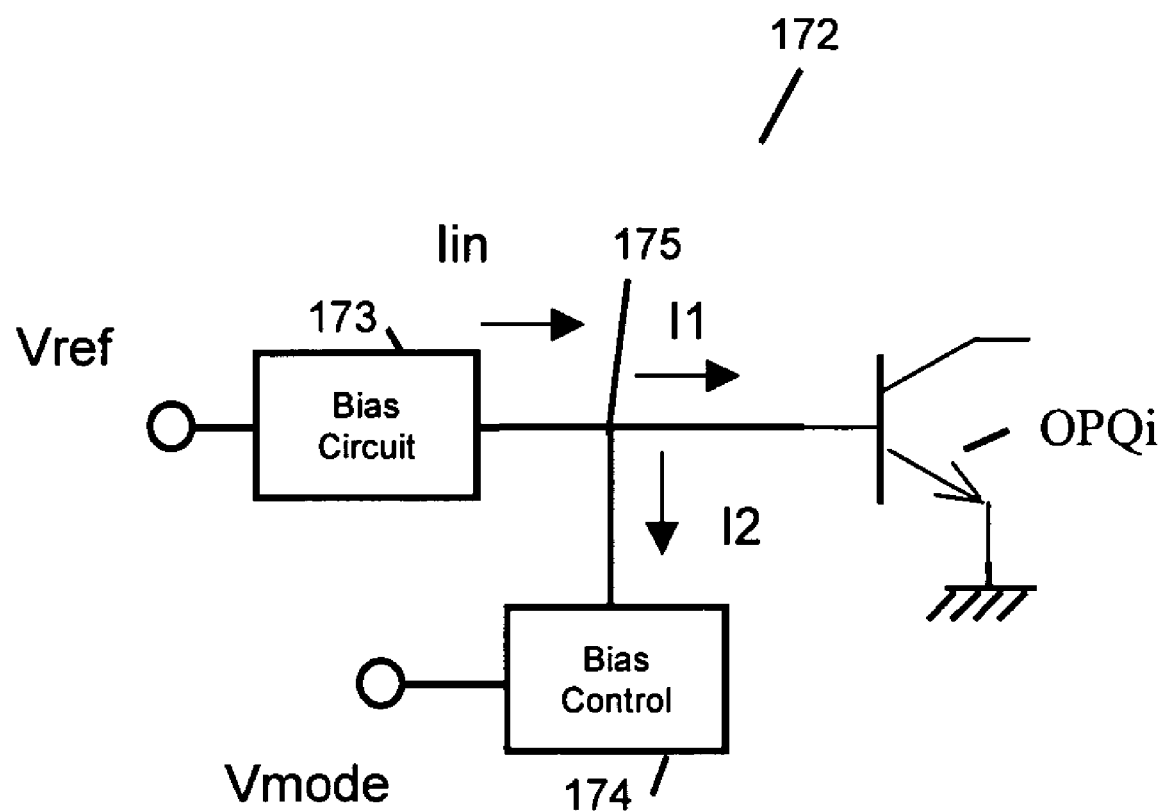
FIG. 4 illustrates a first-stage bias-control circuit according to an embodiment of the invention.

FIG. 4 illustrates an embodiment of a first-stage bias-control (FSBC) network 172 of bias-control network 170. First-stage bias-control 172 includes first-stage bias-circuit 173 and first-stage bias-control 174. First-stage bias-control network 172 is coupled to a reference voltage terminal, where it receives Vref to generate an input current Iin into a first-stage bias-control node 175. First-stage bias-control node 175 is coupled into an output transistor OPQi. First-stage bias-control 174 includes a mode voltage terminal, where it receives a mode voltage Vmode. Vmode can be a digital signal with two or more levels, consisting of one bit or multi-bits. Vmode is determined by the output power, typically sensed by a power detection network, which may or may not be an integral part of the bias control network. Depending on detailed design considerations, Vmode can be used to affect the first stage bias control circuit to reduce the bias current on the first stage when Vmode is enabled logic high. In other embodiments, the bias current can simply be kept unchanged.

Figure 5:
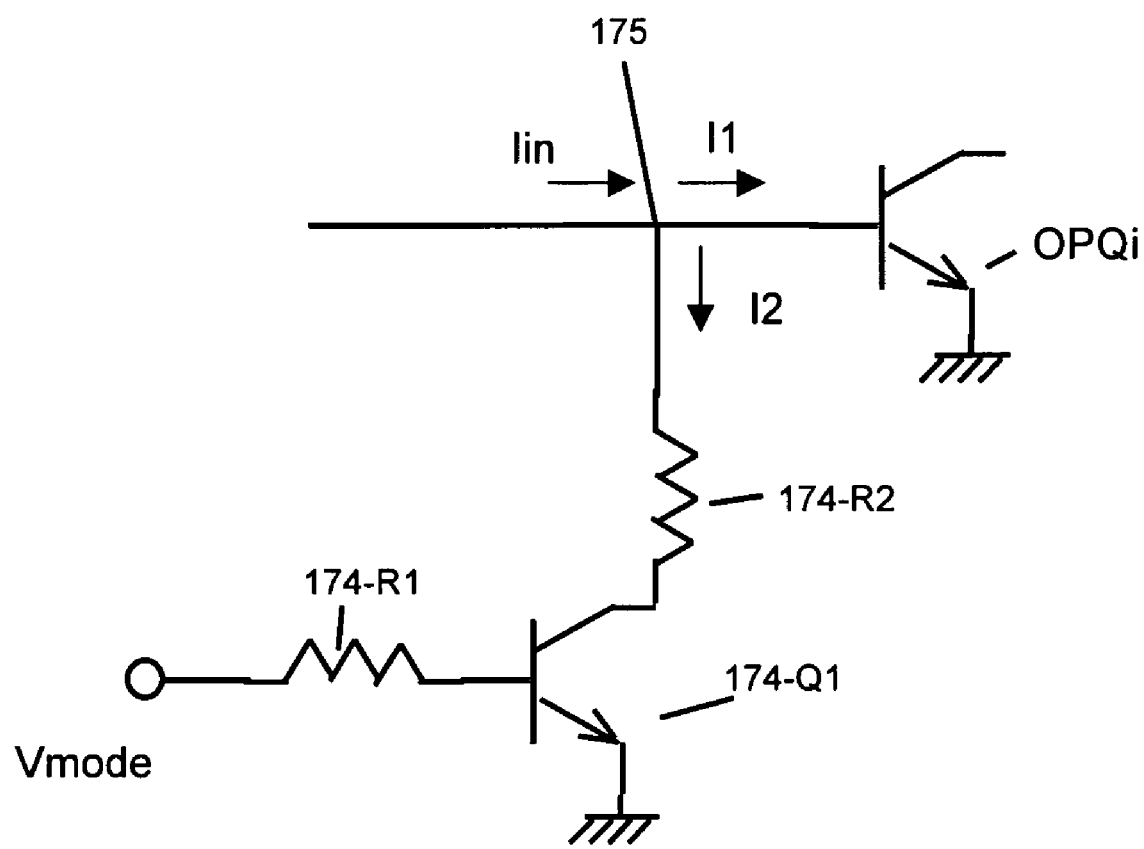
FIG. 5 illustrates a first-stage bias-control circuit according to an embodiment of the invention.

FIG. 5 illustrates a particular embodiment of first-stage bias-control 174 within first-stage bias-control network 172. This embodiment of first-stage bias-control 174 includes a FSBC transistor 174-Q1. The base of FSBC transistor 174-Q1 is coupled to the mode voltage terminal through a FSBC resistor 174-R1. The emitter of FSBC transistor 174-Q1 is coupled to a ground and the collector of FSBC transistor 174-Q1 is coupled to FSBC node 175 through FSBC resistor 174-R2.

Figure 6:
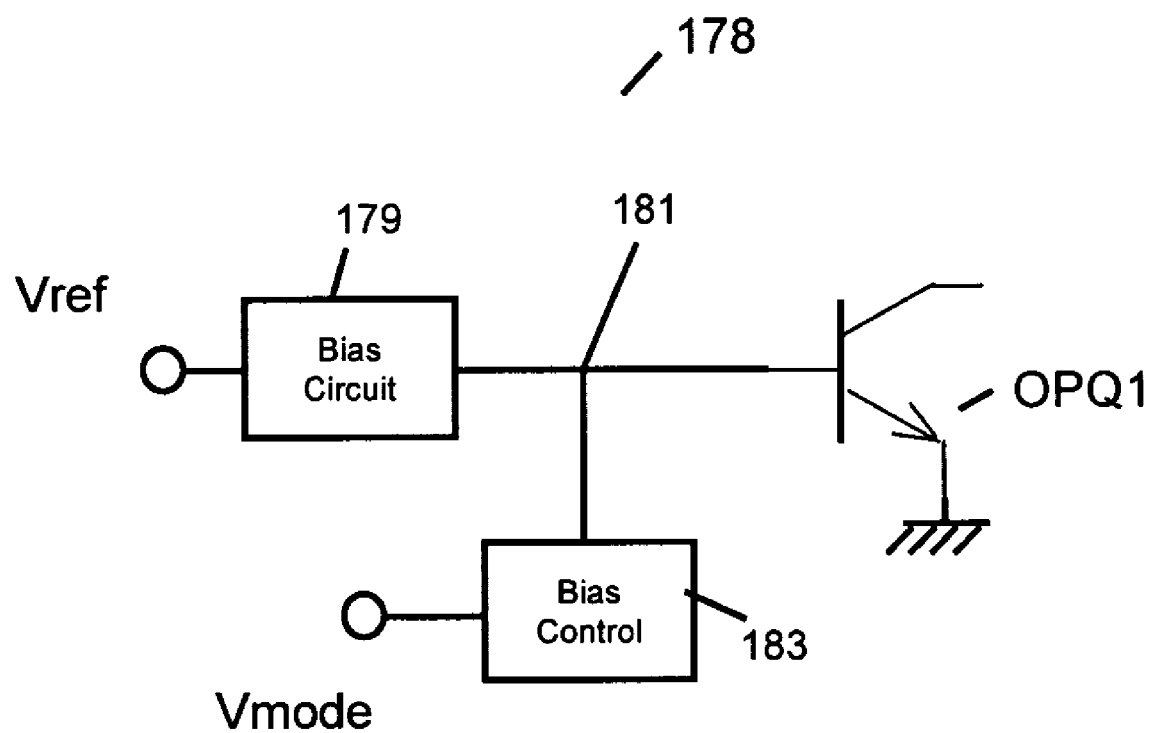
FIG. 6 illustrates a high power bias-control circuit according to an embodiment of the invention.

FIG. 6 illustrates an embodiment of output-stage bias-control (OSBC) network 178 of bias-control network 170. In embodiments, where there are two parallel output stages, a high and a low power output stage, the illustrated embodiment can be the bias-control for the high power output-stage. The layout of high power output-stage bias-control (HPOSBC) network 178 is similar to the layout of first-stage bias-control network 172. HPOSBC network 178 includes a high power output-stage bias-circuit 179, coupled between a reference voltage terminal to receive a reference voltage Vref and a HPOSBC node 181. HPOSBC network 178 further includes high power output-stage bias-control 183, coupled between a mode voltage terminal to receive mode voltage Vmode and HPOSBC node 181. Finally, HPOSBC node 181 is coupled into the control gate, or base, of high power output-stage transistor OPQ1.

A function of output-stage bias-control network 178 is to select and enable the appropriate output stage 130, which is optimized for the sensed output power-range. Individual biasing of output stages 130-i is needed to achieve optimal transmission in the corresponding power-ranges.

A further function of output-stage bias-control network 178 is to isolate the non-selected output stages from the selected output stage by providing a hard shut-off. These functions are controlled by the mode voltage Vmode, received through the mode voltage terminal. As mentioned before, in some embodiments mode voltage Vmode is a two- or multi-level digital signal, in one-bit or multi-bit format. Other embodiments may utilize analog mode voltages.

Figure 7:
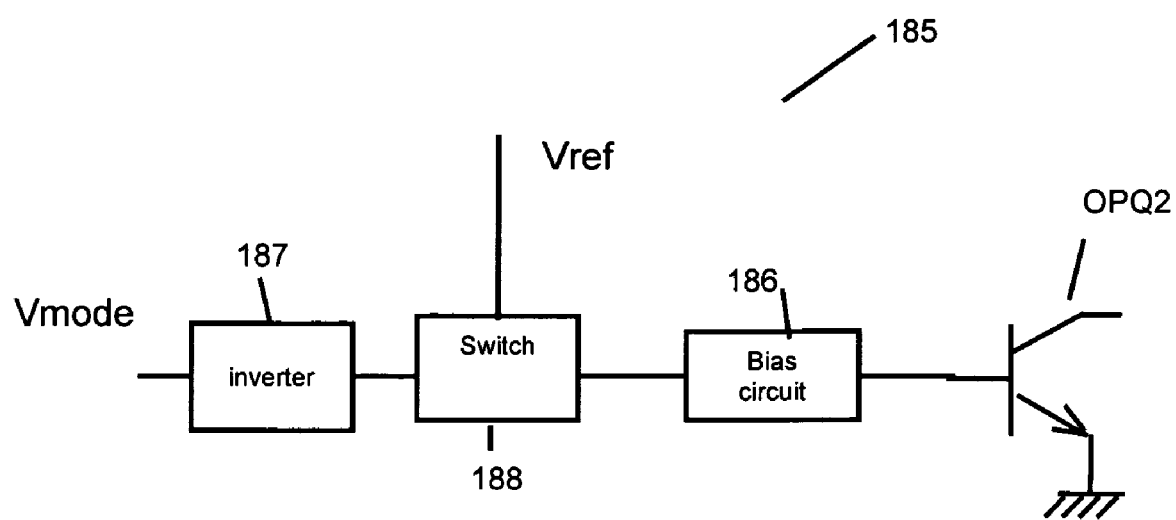
FIG. 7 illustrates a low power bias-control circuit according to an embodiment of the invention.

FIG. 7 illustrates another embodiment of output-stage bias-control (OSBC) network 185 of bias-control network 170. In embodiments, where there are two parallel output stages, a high and a low power output stage, the illustrated embodiment can be the bias-control for the low power output-stage. A feature of the bias control circuit for the low power output stage is that it can hard shut-off the low power device, when the amplifier is in high power mode. This feature is useful because of the high input drive level inputted in the low power amplifier during high power mode operation. Unless the low power device is hard shut-off, the high input drive level can self-bias the low power device, thereby turning it on. This would cause the low power transistor to operate in a highly non-linear mode, degrading the overall linearity of the power amplifier.

The layout of low power output-stage bias-control (LPOSBC) network 178 is similar to the layout of first-stage bias-control network 172. LPOSBC network 178 includes a mode voltage terminal, coupled to an LPOSBC inverter 187. A function of LPOSBC inverter 187 is to invert the mode voltage Vmode, so that when Vmode enables the high power output-stage transistor OPQ1, then the low power output-stage transistor OPQ2 gets the opposite control signal, disabling it. In some embodiments, all output stages 130 receive the same mode voltage Vmode. If there are more than two output stages, a more complex logic circuit is needed to select the output stage based on the common, or shared, mode voltage Vmode.

LPOSBC inverter 187 is coupled to LPOSBC switch 188, which is also coupled to a reference voltage terminal to receive reference voltage Vref. A function of LPOSBC switch 188 is to provide efficient isolation of low power output-stage transistor OPQ2 from high power output-stage transistor OPQ1. This efficient isolation is achieved e.g. by providing a hard shut-off to low power output-stage transistor OPQ2, when high power output-stage transistor OPQ1 is enabled and vice versa. Employing such a LPOSBC switch 188 substantially reduces interference between the output-stage transistors, compared to existing designs. LPOSBC switch 188 is coupled into low power output-stage bias-circuit 186, which is in turn coupled into the control gate, or base, of low power output-stage transistor OPQ2.

Figure 8:
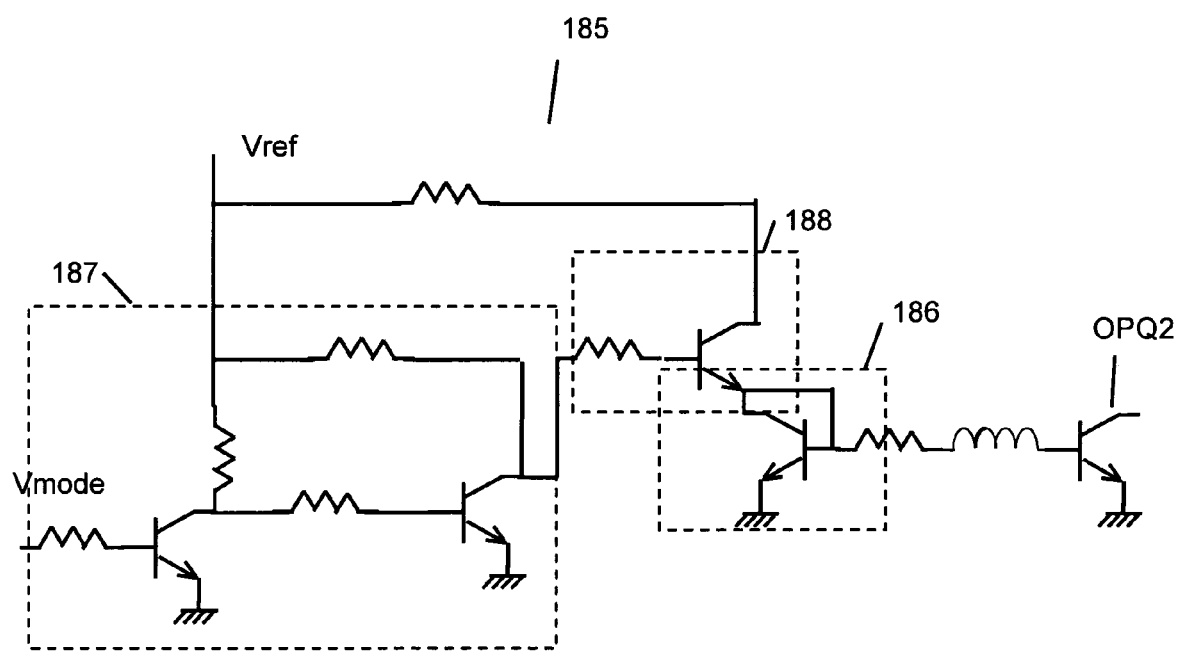
FIG. 8 illustrates a low power bias-control circuit according to an embodiment of the invention.

FIG. 8 illustrates a particular example of a low power output-stage bias-control circuit 185. It includes the same blocks as described in FIG. 7.

Figure 9:
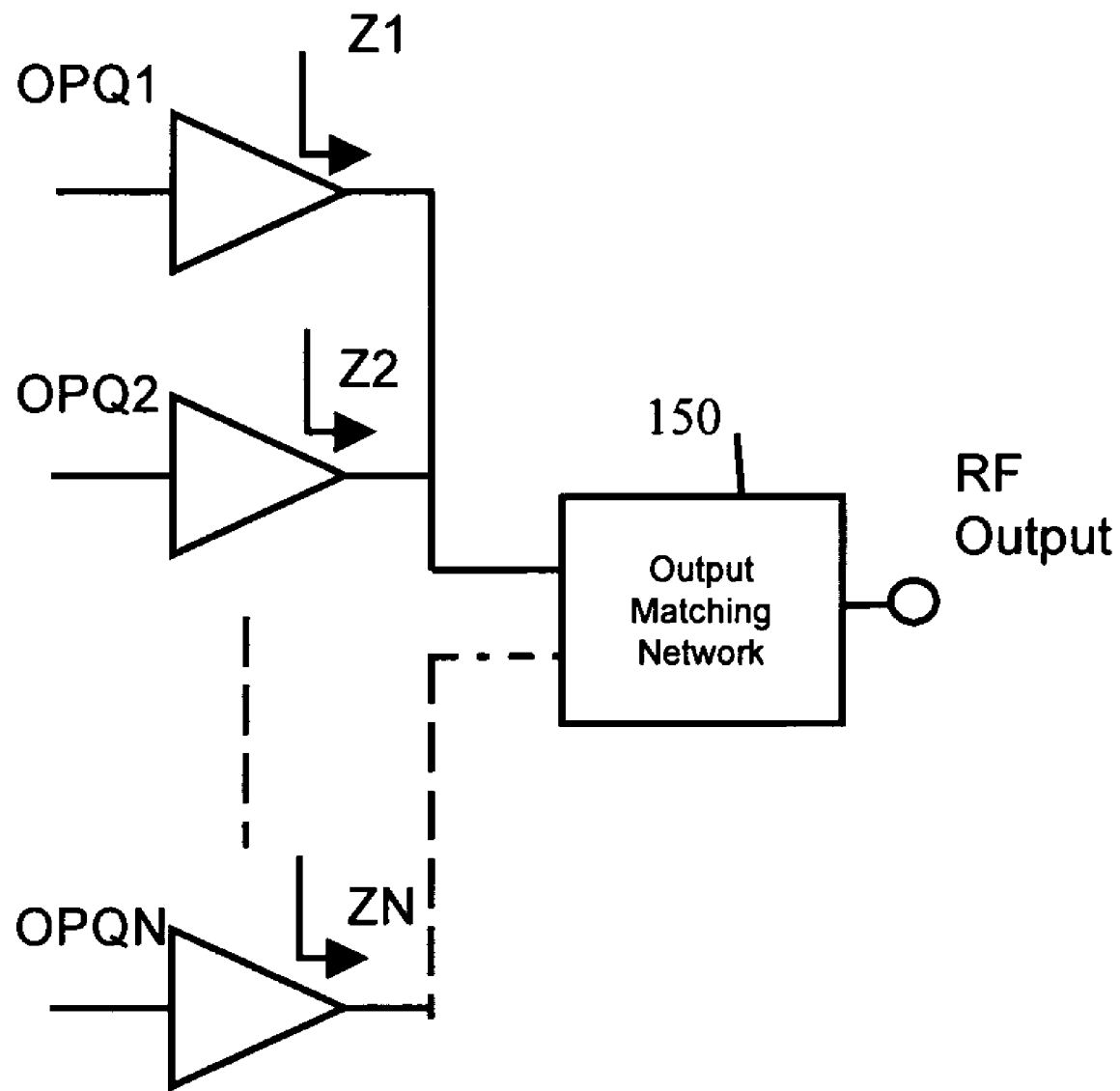
FIG. 9 illustrates an output impedance matching network according to an embodiment of the invention.

FIG. 9 illustrates output stages 130 coupled to output impedance matching network 150. In embodiments, there is a single output impedance matching network 150 coupled to output stages 130-1, . . . , 130-N, saving valuable chip area. The various transmission paths are chosen such that each output stage 130-i "sees" an output impedance optimal for the power-range of that output stage 130-i. Output stages 130-1, . . . , 130-N have impedances Z1, . . . , ZN.

In some embodiments, output impedance matching network 150 does not contain switching elements, such as PIN diodes or varactors. Such a design eliminates the non-linearities, associated with the presence of such switching elements in existing circuits. Also, the efficiencies can be higher due to no switch losses. Eliminating the switching element is an efficient way to improve the linearity and PAE of the power amplifier 100.

Figure 10:
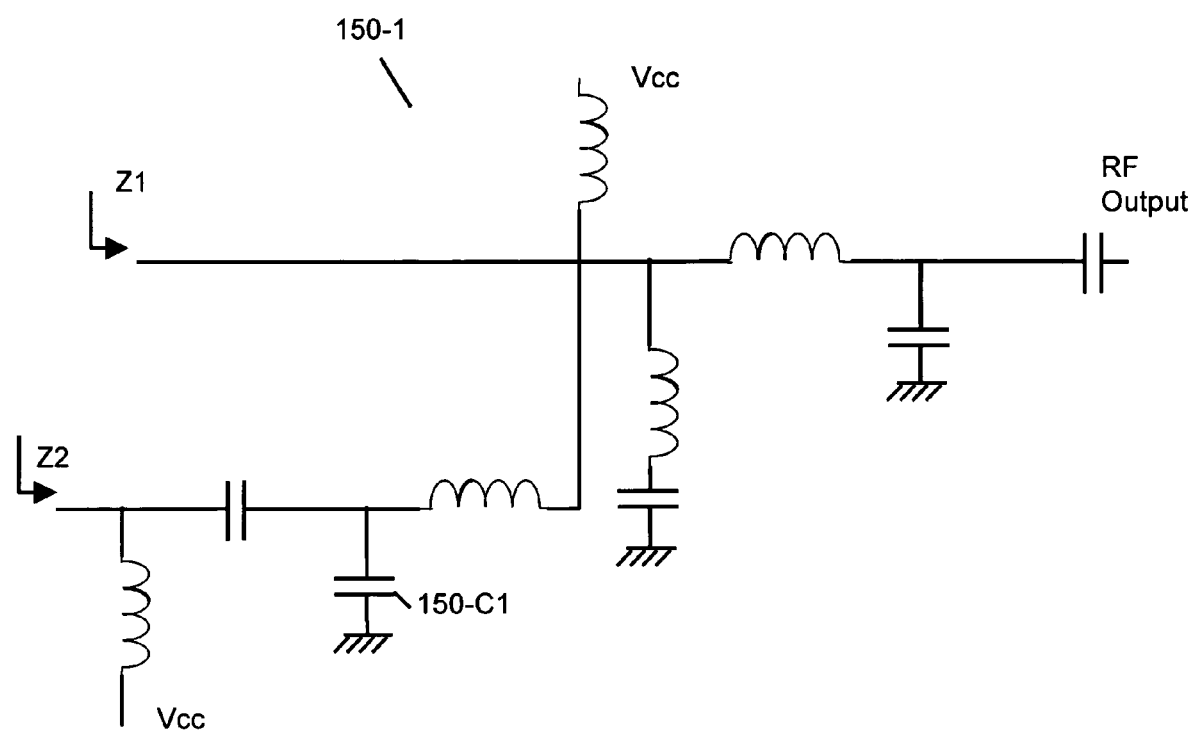
FIG. 10 illustrates an output impedance matching network according to an embodiment of the invention.

FIG. 10 illustrates an embodiment of output impedance matching network 150-1 for an embodiment of power amplifier 100, which has a high power and a low power output stage with impedances Z1 and Z2, respectively. Output impedance matching network 150-1 contains capacitors and inductors, including shunt capacitor 150-C1, and is coupled to supply voltage Vcc. The particular topology of output impedance matching network 150-1 shown in FIG. 10 is one that has been proven to work effectively, although other networks can provide a similar characteristics. The goal in the design of output matching network 150 is to allow output stages 130-1 and 130-2 to "see" transmission paths with different output impedances, with an impedance optimized for the high and low power-range of the high power and low power output stage, respectively.

Figure 11:
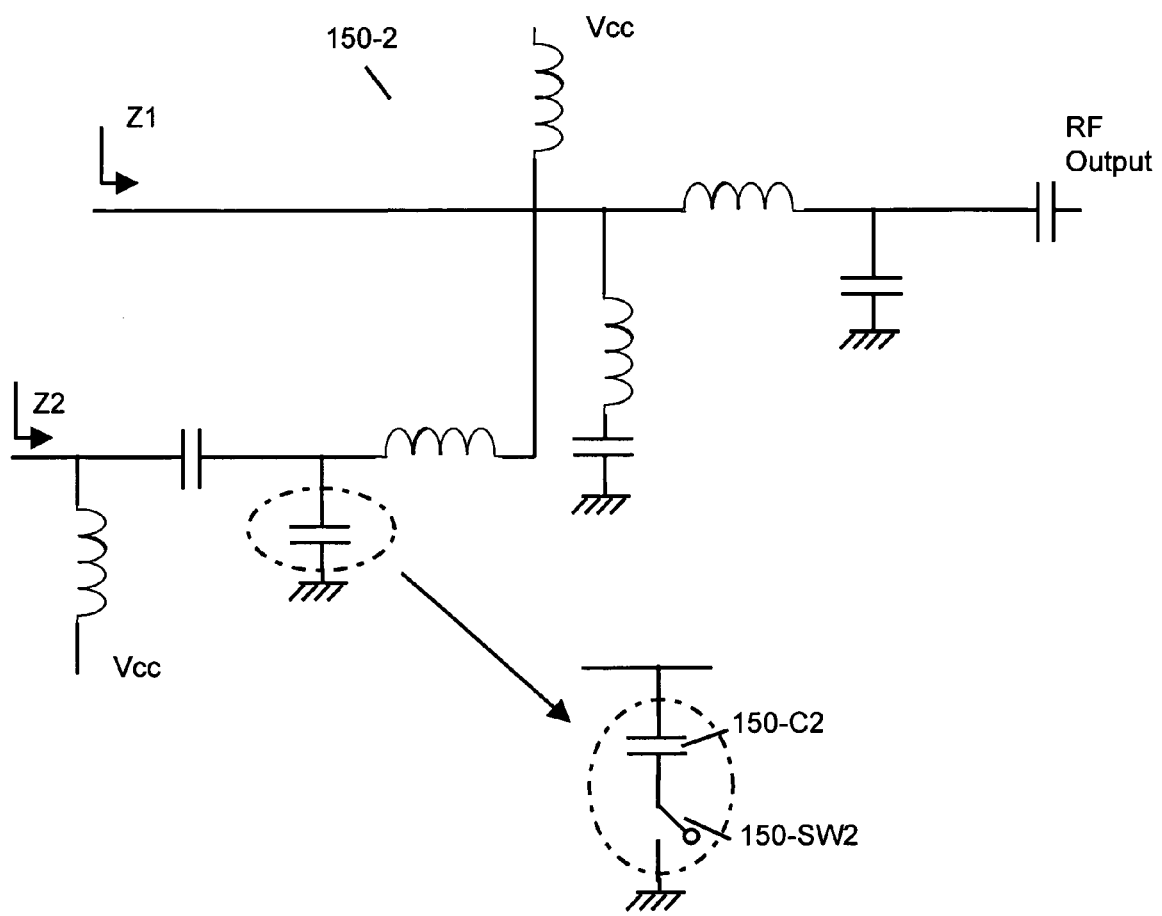
FIG. 11 illustrates an output impedance matching network according to an embodiment of the invention.

FIG. 11 illustrates another embodiment of output impedance matching network 150-2. The capacitors and inductors of output impedance matching network 150-2 are analogous to that of output impedance matching network 150-1. A difference is that a shunt capacitor 150-C2, coupled to the transmission path of the low power output-stage 130-2, now has a switch 150-SW2 coupled to it in series. A role of switch 150-SW2 is to improve the isolation of the low power output path from the high power output path by effectively eliminating shunt capacitor 150-C2, when the high power output-stage is in use.

Figure 12:
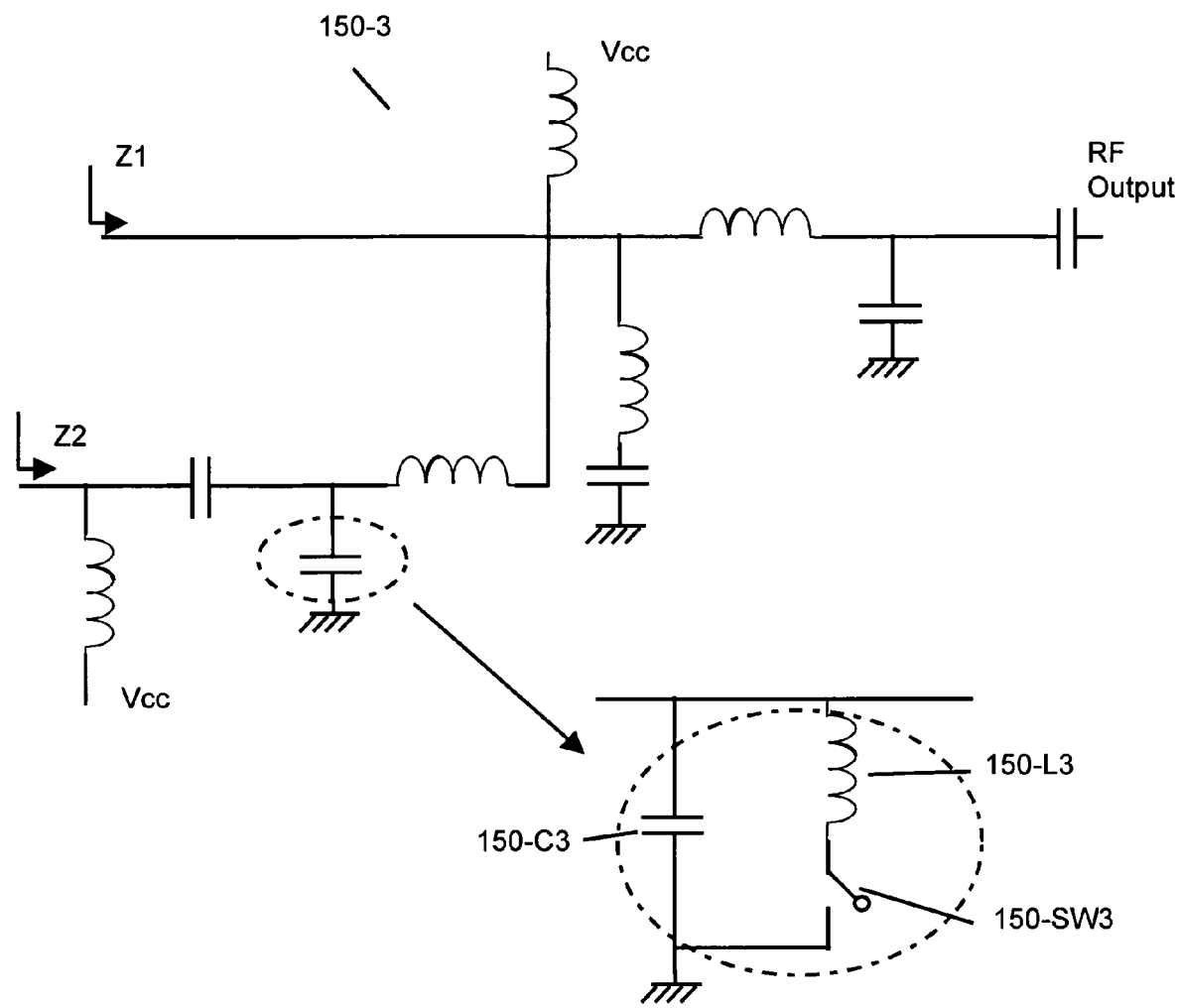
FIG. 12 illustrates an output impedance matching network according to an embodiment of the invention.

FIG. 12 illustrates another embodiment of output impedance matching network 150-3. The capacitors and inductors of output impedance matching network 150-3 are analogous to that of output impedance matching networks 150-1 and 150-2. In addition, shunt capacitor 150-C3 is coupled in parallel with a resonant inductor 150-L3 through switch 150-SW3. When switch 150-SW3 is closed (i.e. conductive), the resonant action of shunt capacitor 150-C3 and resonant inductor 150-L3 "resonates out" shunt capacitor 150-C3, again providing efficient isolation between the transmission paths of the low power and the high power output stages.

Figure 13:
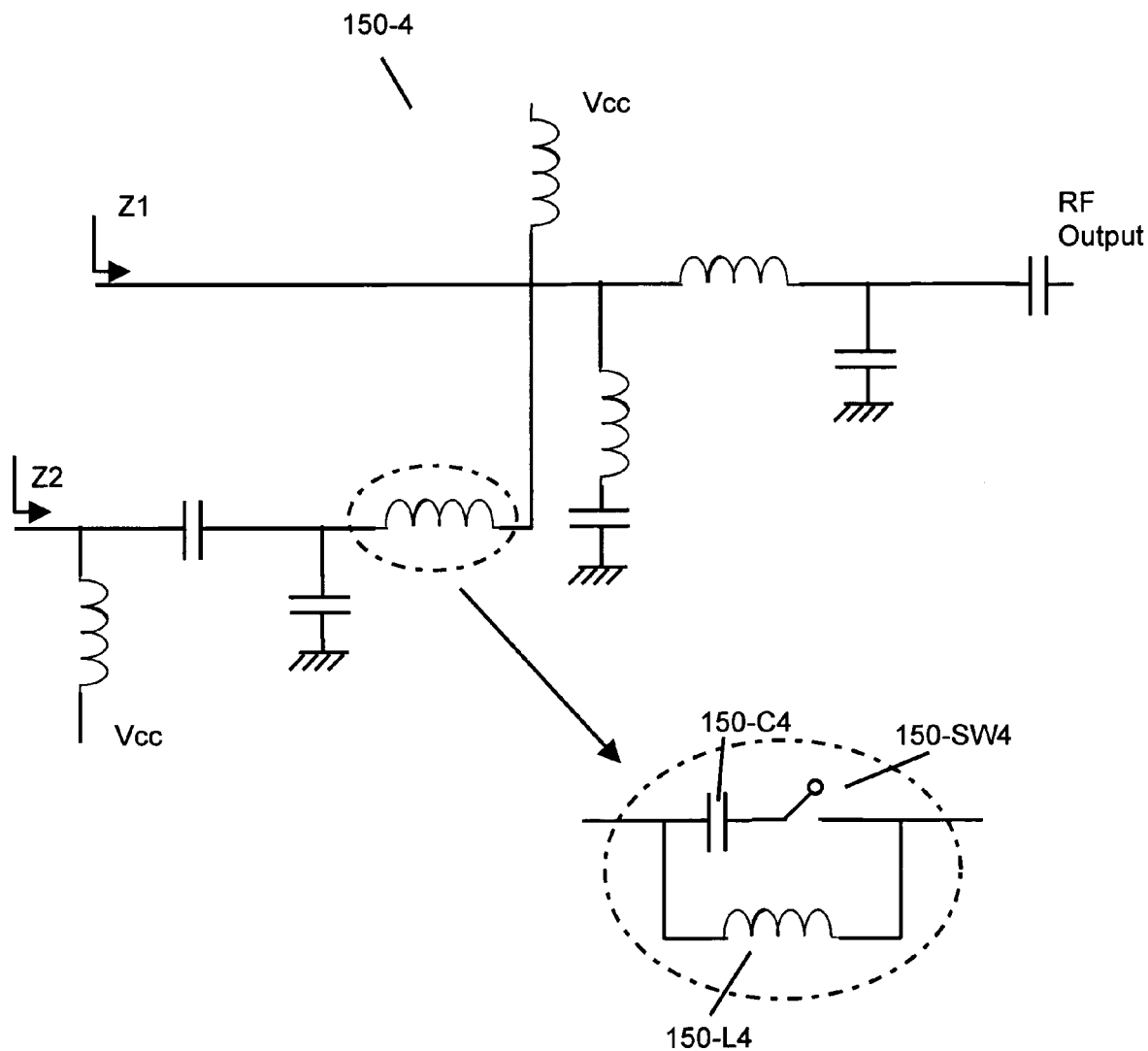
FIG. 13 illustrates an output impedance matching network according to an embodiment of the invention.

FIG. 13 illustrates another embodiment of output impedance matching network 150-4. The capacitors and inductors of output impedance matching network 150-4 are analogous to that of output impedance matching networks 150-1, 150-2, and 150-3. In addition, a resonant capacitor 150-C4 is coupled in parallel with inductor 150-L4 through switch 150-SW4. When switch 150-SW4 is closed (i.e. conductive), the resonant action of resonant capacitor 150-C4 and resonant inductor 150-L4 "resonates out" resonant inductor 150-L4, as if the circuit were open at this node. This design again provides efficient isolation between the transmission paths of the low power and the high power output stages.

Common aspects of the above embodiments of output impedance matching networks are that switch 150-SW is not coupled into the transmission path of the output stage with the highest power-range. Since the switches introduce losses, related to the power flowing across them, avoiding switches in the transmission path of the output stage with the highest power-range reduces the associated losses. Even though utilizing switches may introduce non-linearities into these embodiments, these non-linearities are limited as switch 150-SW is coupled into the transmission path of the low power-range output stage.

It is noteworthy, that in embodiments switching 150-SW of output impedance matching network 150 is different from switching elements of the bias network, in contrast to existing designs. Therefore, embodiments use separate control elements, or networks, for the output impedance matching network 150 and for bias-control network 170. Also note that, when switching the bias network or output impedance matching network modifies the configuration or topology of the transmission path through which the RF signal flows, this is sometimes is referred to as reconfiguring the amplifier.

Although the present invention and its advantages have been described in detail, it should be understood that various changes, substitutions, and alterations can be made therein without departing from the spirit and scope of the invention as defined by the appended claims. That is, the discussion included in this application is intended to serve as a basic description. It should be understood that the specific discussion may not explicitly describe all embodiments possible; many alternatives are implicit. It also may not fully explain the generic nature of the invention and may not explicitly show how each feature or element can actually be representative of a broader function or of a great variety of alternative or equivalent elements. Again, these are implicitly included in this disclosure. Where the invention is described in device-oriented terminology, each element of the device implicitly performs a function. Neither the description nor the terminology is intended to limit the scope of the claims.

What is claimed is:

1. A power amplifier comprising:
an input network;
output stages, coupled in parallel and configured to output power optimally in corresponding power-ranges, the output stages coupled to the input network;
an output impedance matching network, coupled to the output stages and not containing a switching element; and
a bias-control network, coupled between the output impedance matching network, the input network, and the output stages;
wherein individual output stages comprise output transistors, the output transistors having different sizes appropriate to output power in the power-ranges corresponding to the individual output stages.

2. The power amplifier of claim 1, wherein:
the output impedance matching network consists of capacitors and inductors.

3. The power amplifier of claim 1, wherein the bias-control network is configured:
to select an output stage with a power range corresponding to the sensed output power.

4. The power amplifier of claim 3, wherein the bias-control network is configured:
to enable an output transistor of the selected output stage by providing appropriate bias; and
to isolate output transistors of the non-selected output stages by providing a hard shut-off.

5. The power amplifier of claim 1, the input network comprising:
a single radio-frequency input circuit.

6. The power amplifier of claim 1, the input network comprising:
an input matching network; and
a shared first amplifier stage, coupled to the input matching network and the bias network.

7. The power amplifier of claim 1, further comprising:
an inter-stage matching network, operable to minimize a signal-reflection between the input network and the output stages.

8. The power amplifier of claim 7, wherein:
the inter-stage matching network is operable to provide a resistive isolation between the input network and the output stages.

9. A power amplifier comprising:
an input network;
output stages coupled in parallel and configured for outputting power optimally in corresponding ranges, the output stages coupled to the input network;
an output impedance matching network, coupled to the output stages; and
a bias-control network, coupled between the output impedance matching network, the input network, and the output stages;
wherein the output impedance matching network does not contain a switching element for the output stage configured to output power in the highest range;
wherein the output impedance matching network comprises a switching element for at least one output stage configured to output power in a range other than the highest range.

10. The power amplifier of claim 9, wherein:
the switching element is not coupled in series with any of the output path.

11. The power amplifier of claim 10, wherein:
the switching element of the output impedance matching network is different from switching elements of the bias network.

12. The power amplifier of claim 9, wherein:
the output impedance matching network comprises capacitors and inductors.

13. The power amplifier of claim 12, wherein:
the switching element is in series with a shunt capacitor.

14. The power amplifier of claim 12, wherein:
an inductor is coupled in parallel to a shunt capacitor; and
the switching element is coupled in series with the inductor.

15. The power amplifier of claim 14, wherein:
switching of the switching element resonates out the capacitor from the output impedance matching network.

16. The power amplifier of claim 12, wherein:
an inductor is coupled into an output path; and
the switching element, in series with a capacitor, is coupled in parallel to the inductor.

17. The power amplifier of claim 9, wherein the bias-control network is configured:
to sense the output power; and
to select an output stage with a power range corresponding to the sensed output power.

18. The power amplifier of claim 17, wherein the bias-control network is configured:
to enable the output transistor of the selected output stage by providing appropriate bias; and
to isolate the output transistors of the non-selected output stages by providing a hard shut-off.

19. A power amplifier comprising:
an input network;
output stages, coupled in parallel and configured to output power optimally in corresponding power-ranges, the output stages coupled to the input network;
an output impedance matching network, coupled to the output stages; and
a bias-control network, coupled between the output impedance matching network, the input network, and the output stages, wherein:
the bias-control network is configured to isolate output stages by providing a hard shut-off to transistors of the isolated output stages, wherein the bias-control network comprising bias circuits corresponding to output stages, the bias circuits individually comprising:
a mode-control terminal;
a switch, coupled to the mode control terminal;
a reference voltage terminal, coupled to the switch; and
a bias circuit, coupled to the switch, wherein the bias circuit controls an input of a corresponding output stage.

20. The power amplifier of claim 19, wherein the bias-control network is configured:
to sense an output power; and
to select an output stage with a power range corresponding to the sensed output power.

21. The power amplifier of claim 20, wherein the bias-control network is configured:
to enable an output transistor of the selected output stage by providing appropriate bias; and
to isolate the non-selected output stages.

22. The power amplifier of claim 19, wherein:
the power amplifier comprises a high power range and a low power range output stage; and
the bias-control network comprises a high power bias circuit and a low power bias circuit, the low power bias circuit comprising an inverter.

23. The power amplifier of claim 19, wherein:
the bias-control network selects an output stage according a mode control voltage received at the mode control terminal.

24. The power amplifier of claim 23, wherein:
the output stage is selected by a mode control voltage signal comprising one of a single-bit and multi-bit signals.

25. The power amplifier of claim 19, wherein:
the switch is operable to provide the hard shut-off to the corresponding output stage.

26. The power amplifier of claim 19, wherein:
the output impedance matching network comprises switching elements, different from switching elements of the bias-control network.

27. The power amplifier of claim 19, wherein:
the bias-control network is configured to reconfigure a shared first amplifier stage.

* * * * *